US007956516B2

(12) United States Patent
Hayashi et al.

(10) Patent No.: US 7,956,516 B2
(45) Date of Patent: Jun. 7, 2011

(54) ULTRASONIC SENSOR AND METHOD FOR MANUFACTURING THE SAME

(75) Inventors: Seigo Hayashi, Kanazawa (JP); Masanaga Nishikawa, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/189,854

(22) Filed: Aug. 12, 2008

(65) Prior Publication Data

US 2008/0290758 A1 Nov. 27, 2008

Related U.S. Application Data

(63) Continuation of application No. PCT/JP2007/051890, filed on Feb. 5, 2007.

(30) Foreign Application Priority Data

Feb. 14, 2006 (JP) ................................ 2006-036219

(51) Int. Cl.
*H01L 41/053* (2006.01)

(52) U.S. Cl. ......................... 310/334; 310/326; 310/348

(58) Field of Classification Search .................. 310/322, 310/334, 335, 326, 348
See application file for complete search history.

(56) References Cited

U.S. PATENT DOCUMENTS 4,326,274 A * 4/1982 Hotta et al. ................... 367/118
4,556,814 A * 12/1985 Ito et al. ......................... 310/334
4,735,087 A * 4/1988 Hourani et al. ................. 73/597
6,520,019 B1 * 2/2003 Schon et al. .................... 73/632
2003/0121331 A1 * 7/2003 Mitsuoka et al. ............... 73/632
2006/0241474 A1 * 10/2006 Kawashima et al. ......... 600/459

FOREIGN PATENT DOCUMENTS

JP 56-41427 U 4/1981
JP 58-206732 A 12/1983
JP 61-33598 U 2/1986
JP 02-017483 A 1/1990
JP 02-301398 A 12/1990
JP 06-105844 A 4/1994
JP 07-011100 U 2/1995
JP 11-266498 A 9/1999
JP 2001-045595 A 2/2001
JP 2002-058097 A 2/2002
JP 2006-279113 A 10/2006
JP 2006-352829 A 12/2006

OTHER PUBLICATIONS

Official Communication issued in International Patent Application No. PCT/JP2007/051890, mailed on May 15, 2007.

* cited by examiner

*Primary Examiner* — Derek J Rosenau
(74) *Attorney, Agent, or Firm* — Keating & Bennett, LLP

(57) ABSTRACT

An ultrasonic sensor includes a cylindrical casing having a bottom portion. The casing has a piezoelectric element on a bottom surface thereof. A substrate is attached to an end surface of an opening portion of the casing with a damping member provided therebetween such that the damping member covers the opening portion. Pin terminals are arranged so as to extend through the substrate and the damping member and are electrically connected to the piezoelectric element with lead wires. An inner space of the casing is filled with foamable resin.

10 Claims, 3 Drawing Sheets

ULTRASONIC SENSOR AND METHOD FOR MANUFACTURING THE SAME

BACKGROUND OF THE INVENTION

1. Field of the Invention

The present invention relates to ultrasonic sensors and methods for manufacturing the ultrasonic sensors, and more particularly, to an ultrasonic sensor included in, for example, a backup sensor of an automobile.

2. Description of the Related Art

FIG. 4 is a diagram illustrating an example of a known ultrasonic sensor. An ultrasonic sensor 1 includes a cylindrical casing 2 having a bottom portion and made of aluminum or other suitable material. An inner bottom surface of the casing 2 is bonded to a surface of a piezoelectric element 3 at one side thereof. An inner space of the casing 2 is substantially entirely filled with foamable resin 4, such as foamable silicone, so that the piezoelectric element 3 is covered with the foamable resin 4. In addition, a substrate 6 having terminals 5*a* and 5*b* is attached to an opening portion of the casing 2 so as to cover the foamable resin 4. Electrodes 7*a* and 7*b*, which are respectively connected to the terminals 5*a* and 5*b*, are provided on either side of the substrate 6. The terminal 5*a* is connected to a surface of the piezoelectric element 3 at the other side thereof through the electrode 7*a* provided on an inner surface of the substrate 6 and a wire 8. The terminal 5*b* is connected to the surface of the piezoelectric element 3 at the one side thereof through the electrode 7*b* on an outer surface of the substrate 6, solder 9, and the casing 2.

When measuring a distance to an object using the ultrasonic sensor 1, the piezoelectric element 3 is excited by applying a drive voltage to the terminals 5*a* and 5*b*. The bottom surface of the casing 2 is vibrated in response to vibration of the piezoelectric element 3. As a result, ultrasonic waves are emitted in a direction substantially perpendicular to the bottom surface, as indicated by an arrow in FIG. 4. When the ultrasonic waves emitted by the ultrasonic sensor 1 are reflected by the object and return to the ultrasonic sensor 1, the piezoelectric element 3 is vibrated. The vibration of the piezoelectric element 3 is converted into an electric signal, and the electric signal is output from the terminals 5*a* and 5*b*. The distance between the ultrasonic sensor 1 and the object can be determined by measuring the time from when the drive voltage is applied to when the electric signal is output.

In the ultrasonic sensor 1, vibration of the overall body of the casing 2 is suppressed because the inner space of the casing 2 is filled with the foamable resin 4. Also, ultrasonic waves that are emitted toward the inside of the casing 2 are dispersed and absorbed by the large number of pores in the foamable resin 4. Thus, vibration of the casing 2 itself and the ultrasonic waves remaining in the casing 2 can both be efficiently reduced and reverberation characteristics can be improved (see Japanese Unexamined Patent Application Publication No. 11-266498).

Since the ultrasonic sensor 1 includes the terminals 5*a* and 5*b*, the ultrasonic sensor 1 can be mounted by automation. However, since the substrate 6 including the terminals 5*a* and 5*b* is attached to the casing 2 such that the substrate 6 is in direct contact with side surfaces of the casing 2, vibration of the piezoelectric element 3 is transmitted through the casing 2 and the substrate 6 and is damped through the terminals 5*a* and 5*b*.

FIG. 5 is a diagram illustrating an example of a new ultrasonic sensor that provides a basis for the present invention. In an ultrasonic sensor 1' shown in FIG. 5, in contrast to the ultrasonic sensor 1 shown in FIG. 4, a disc-shaped substrate 6*a* including terminals 5*a* and 5*b* is not attached to a casing 2 such that the substrate 6*a* is in direct contact with the casing 2. Instead, the substrate 6*a* is fitted in a hole provided at the approximate center of a damping member 6*b* that is made of silicone rubber and that is fitted over an opening portion of the cylindrical casing 2 having a bottom portion. Thus, the substrate 6*a* is attached such that the substrate 6*a* is in contact with the foamable resin 4. The terminal 5*a* is connected to a piezoelectric element 3 through a wire 8*a*, and the terminal 5*b* is connected to the piezoelectric element 3 through a wire 8*b* and the casing 2.

In the ultrasonic sensor 1' shown in FIG. 5, the substrate 6*a* is not in direct contact with the casing 2. Therefore, transmission of vibration from the piezoelectric element 3 to the substrate 6*a* and the terminals 5*a* and 5*b* through the casing 2 is suppressed by the damping member 6*b*. In other words, in the ultrasonic sensor 1', vibration of the piezoelectric element 3 is not easily transmitted to the substrate 6*a* or the terminals 5*a* and 5*b*, and is not easily damped.

To perform automated mounting, the terminals must have extremely high positional accuracy. However, in the ultrasonic sensor 1' shown in FIG. 5, the substrate 6*a* including the terminals 5*a* and 5*b* is fitted in the hole provided at the approximate center of the damping member 6*b*. Therefore, the perpendicularity of the terminals 5*a* and 5*b* with respect to the casing 2 and the piezoelectric element 3 is degraded and the positional accuracy of end portions of the terminals 5*a* and 5*b* with respect to the casing 2 and the piezoelectric element 3 is reduced.

In addition, in the ultrasonic sensor 1' shown in FIG. 5, if an external stress is applied after the ultrasonic sensor 1' is mounted, for example, if a top surface (surface at the piezoelectric-element-3 side) is pushed from the outside, the foamable resin 4, which is soft, is severely deformed. As a result, large stress and displacement may occur in areas where the terminals 5*a* and 5*b* are connected to the lead wires 8*a* and 8*b*, respectively. This may lead to defects, such as disconnection, for example.

SUMMARY OF THE INVENTION

To overcome the problems described above, preferred embodiments of the present invention provide an ultrasonic sensor in which vibration of a piezoelectric element is not easily damped, which has high positional accuracy at end portions of terminals, and which is resistant to external stress, and a method for manufacturing the ultrasonic sensor.

According to a preferred embodiment of the present invention, the ultrasonic sensor includes a cylindrical casing having a bottom, a piezoelectric element disposed on an inner bottom surface of the casing, a terminal electrically connected to the piezoelectric element, and a substrate to which the terminal is fixed. The substrate is attached to the casing with a damping member provided therebetween, and the damping member suppresses transmission of vibration. The damping member is disposed between an end surface of the casing and a principal surface of the substrate so as to cover an opening portion of the casing.

Preferably, the damping member is configured to cover a portion of the casing and a portion of the substrate.

Preferably, a portion of the terminal that is disposed in the substrate is subjected to a bending process.

Preferably, the substrate includes a holder arranged to hold at least a portion of the terminal that is near an end thereof.

A method for manufacturing an ultrasonic sensor according to another preferred embodiment of the present invention includes a step of disposing a piezoelectric element on an inner bottom surface of a cylindrical casing having a bottom portion, a step of electrically connecting the piezoelectric element to a terminal fixed to a substrate, a step of forming a through hole to be filled with a filler in the substrate and a damping member arranged to suppress transmission of vibration, a step of disposing the damping member between an end surface of an opening portion of the casing and a principal surface of the substrate such that the substrate is attached to the casing with the damping member arranged therebetween and such that the damping member covers the opening portion of the casing, and a step of filling an inner space of the casing with the filler through the through hole extending through the substrate and the damping member.

In the step of forming the through hole, the through hole may be formed in the substrate and the damping member simultaneously after the substrate and the damping member are stacked together, or may be formed in the substrate and the damping member independently.

In addition, in the step of disposing the damping member, the damping member may be disposed on the opening portion after the substrate and the damping member are stacked together. Alternatively, the substrate may be disposed on the damping member after the damping member is disposed on the opening portion of the casing.

In the ultrasonic sensor according to preferred embodiments of the present invention, the piezoelectric element is disposed on the casing, and the substrate to which the terminal is fixed is attached to the casing with the damping member that covers the opening portion of the casing disposed therebetween. Thus, the substrate is not in direct contact with the casing. As a result, transmission of vibration from the piezoelectric element toward the substrate and the terminal is suppressed by the damping member. In other words, vibration of the piezoelectric element is not easily transmitted to the substrate and the terminal and is not easily damped.

In addition, the damping member is disposed between the end surface of the casing and the principal surface of the substrate. Thus, the principal surface of the substrate faces the end surface of the casing, which is relatively hard, across the damping member. Therefore, the degree to which the substrate is level with respect to the casing and the piezoelectric element is ensured and the perpendicularity of the terminal with respect to the casing and the piezoelectric element is improved. As a result, the positional accuracy of an end portion of the terminal with respect to the casing and the piezoelectric element can be increased.

Even when, for example, a top surface (surface at the piezoelectric-element side) of the ultrasonic sensor is pressed from the outside after the ultrasonic sensor is mounted, the casing and the piezoelectric element does not substantially move relative to the substrate and the terminal. Therefore, large stress or displacement does not occur in an electrical connecting portion of the terminal in the ultrasonic sensor. As a result, defects, such as disconnection, for example, do not easily occur.

In the ultrasonic sensor according to preferred embodiments of the present invention, if the damping member is configured so as to cover a portion of the casing and a portion of the substrate, the casing, the damping member, and the substrate can be easily positioned with respect to each other, and therefore, the ultrasonic sensor can be easily assembled.

In addition, if a portion of the terminal that is disposed in the substrate is subjected to a bending process, the terminal is securely fixed to the substrate. Therefore, the terminal is prevented from being even slightly pushed into or pulled out from the substrate. Thus, the positional accuracy of the end portion of the terminal can be increased. In addition, in this case, the position of the terminal on the side of the one principal surface of the substrate can be different from that on the side of the other principal surface of the substrate. Therefore, the degree of freedom in the arrangement of the terminal and arrangement of the ultrasonic sensor can be increased.

In addition, if the substrate includes a holder arranged to hold at least a portion of the terminal that is near an end thereof, the portion of the terminal near the end thereof is held by the holder. Therefore, the positional accuracy of the end portion of the terminal is increased.

In addition, in the method for manufacturing the ultrasonic sensor according to preferred embodiments of the present invention, first, the substrate and the damping member are disposed on the casing. Then, the filler is introduced into the casing through the through hole provided in the substrate and the damping member. Thus, the damping member functions as a lid of the casing and the inner space of the casing can be filled with the filler without leaving unfilled spaces. In addition, since the inner space of the casing is filled with the filler while the substrate and the damping member placed on the end surface of the casing is maintained in a level orientation, the end portion of the pin terminal is prevented from being displaced. In addition, the damping member is held and fixed to the end surface of the opening portion of the casing by the filler from the inside of the casing. Therefore, the damping member can be maintained in a level orientation, and the positional accuracy of the pin terminal can be reliably ensured even when, for example, an external force is applied.

Preferred embodiments of the present invention provide an ultrasonic sensor in which vibration of a piezoelectric element is not easily damped, which has high positional accuracy at end portions of terminals, and which is resistant to external stress, and a method for manufacturing the ultrasonic sensor.

The above and other elements, features, steps, characteristics and advantages of the present invention will become more clearly understood from the description of preferred embodiments and the best mode for carrying out the invention provided below in conjunction with the drawings.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
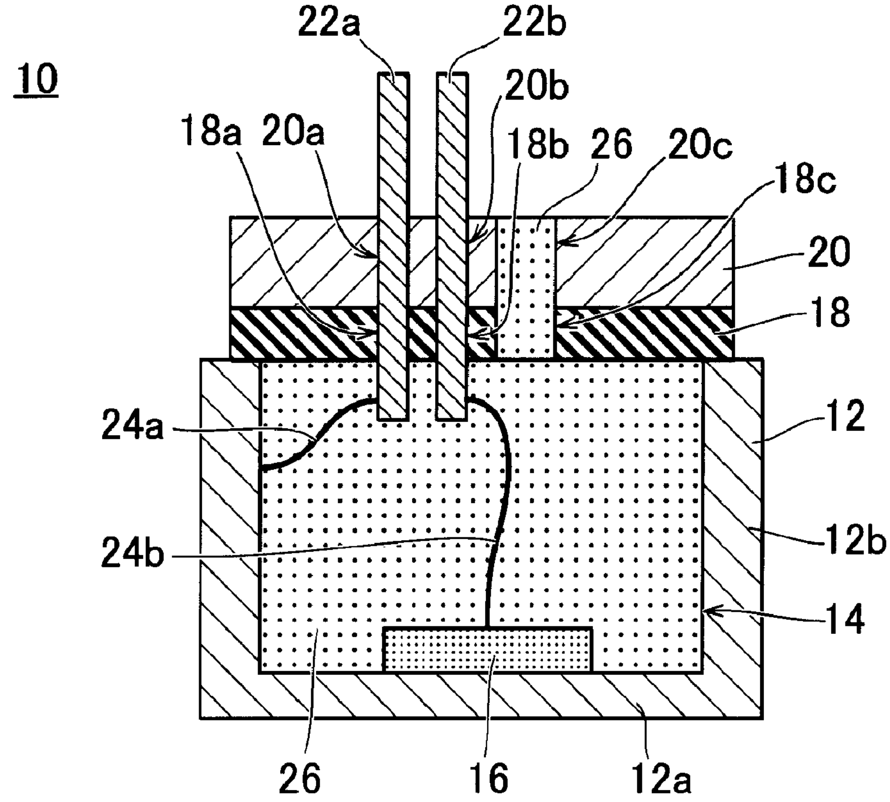
FIG. 1 shows a preferred embodiment of an ultrasonic sensor according to the present invention.

FIG. 1 shows a preferred of an ultrasonic sensor according to the present invention. An ultrasonic sensor 10 shown in FIG. 1 includes, for example, a substantially cylindrical casing 12. The casing 12 includes a substantially disc-shaped bottom portion 12*a* and a cylindrical side wall 12*b*. The casing 12 is made of, for example, a metal material such as aluminum. A hollow portion 14 in the casing 12 is configured so as to have, for example, a circular or substantially circular cross section. The manner in which ultrasonic waves emitted from the ultrasonic sensor 10 are transmitted is determined by the shape of the hollow portion 14. Therefore, the design may also be changed so that the hollow portion 14 has other shapes, such as an elliptical shape in cross section, in accordance with the required characteristics.

A piezoelectric element 16 is attached to an inner surface of the bottom portion 12*a* of the casing 12. The piezoelectric element 16 is obtained by, for example, forming electrodes on either principal surface of a disc-shaped piezoelectric substrate. The electrode on one principal surface of the piezoelectric element 16 is attached to the bottom portion 12*a* with a conductive adhesive or other suitable adhesive.

A damping member 18 made of, for example, silicone rubber is attached to an end surface of an opening portion of the casing 12. The damping member 18 suppresses transmission of unnecessary vibration from the casing 12 or the piezoelectric element 16 to the outside, and also suppresses entrance of unnecessary vibration from the outside to the casing 12 or the piezoelectric element 16. The damping member 18 has a substantially disc shape with an outer diameter that is somewhat smaller than the outer diameter of the casing 12 and somewhat larger than the inner diameter of the casing 12. The damping member 18 is arranged such that a peripheral area of one principal surface of the damping member 18 faces the end surface of the opening portion of the casing 12 and such that the center of the damping member 18 and the center of the casing 12 are on approximately the same straight line. Thus, the damping member 18 is arranged so as to cover the opening portion of the casing 12. The damping member 18 includes two terminal holes 18*a* and 18*b* and a single resin hole 18*c*, which functions as a through hole, provided in the damping member 18 at positions spaced from each other such that the terminal holes 18*a* and 18*b* and the resin hole 18*c* extend through the principal surfaces of the damping member 18 in a direction substantially perpendicular to the principal surfaces and communicate with the hollow portion 14 in the casing 12.

A substantially disc-shaped substrate 20 preferably composed of, for example, a glass epoxy substrate, is attached to the other principal surface of the damping member 18. An outer diameter of the substrate 20 is substantially equal to that of the damping member 18. The substrate 20 is arranged such that one principal surface of the substrate 20 faces the other principal surface of the damping member 18 and the center of the substrate 20 is on approximately the same straight line as the center of the casing 12 and the center of the damping member 18. Thus, the damping member 18 is disposed between the end surface of the opening portion of the casing 12 and the one principal surface of the substrate 20. The substrate 20 includes two terminal holes 20*a* and 20*b* and a single resin hole 20*c*, which functions as a through hole, provided in the substrate 20 such that the terminal holes 20*a* and 20*b* and the resin hole 20*c* extend through the principal surfaces of the substrate 20 in a direction substantially perpendicular to the principal surfaces. The terminal holes 20*a* and 20*b* and the resin hole 20*c* are arranged so as to correspond to the terminal holes 18*a* and 18*b* and the resin hole 18*c*, respectively, in the damping member 18.

Two linear pin terminals 22*a* and 22*b* are press-fitted to the terminal holes 20*a* and 20*b*, respectively, and are thereby fixed to the substrate 20. Portions of the pin terminals 22*a* and 22*b* near one end thereof are disposed at the side of the one principal surface of the substrate 20, that is, at the inner side of the substrate 20. Portions of the pin terminals 22*a* and 22*b* near the other end thereof are disposed at the side of the other principal surface of the substrate 20, that is, at the outer side of the substrate 20. The portions of the pin terminals 22*a* and 22*b* near the one end thereof extend through the terminal holes 18*a* and 18*b*, respectively, in the damping member 18 so that the ends of the portions are disposed in the hollow portion 14 of the casing 12.

One end of a lead wire 24*a* that is preferably made of, for example, a polyurethane copper wire and that functions as a connecting member is soldered to the inner surface of the side wall 12*b* of the casing 12. The lead wire 24*a* is electrically connected to the electrode on the one principal surface of the piezoelectric element 16 through the casing 12. The other end of the lead wire 24*a* is soldered to an end portion of the pin terminal 22*a* at the one end thereof. Thus, the electrode on the one principal surface of the piezoelectric element 16 is electrically connected to the pin terminal 22*a* through the casing 12 and the lead wire 24*a*.

One end of a lead wire 24*b* that is made of, for example, a polyurethane copper wire and that functions as a connecting member is soldered to the electrode on the other principal surface of the piezoelectric element 16. The other end of the lead wire 24*b* is soldered to an end portion of the pin terminal 22*b* at the one end thereof. Thus, the electrode on the other principal surface of the piezoelectric element 16 is electrically connected to the pin terminal 22*b* through the lead wire 24*b*.

The inner space of the casing 12, the resin hole 18*c* in the damping member 18, and the resin hole 20*c* in the substrate 20 are filled with foamable resin 26, such as foamable silicone, that functions as a filler.

Next, an example of a method for manufacturing the ultrasonic sensor 10 will be described.

First, the casing 12 and the piezoelectric element 16 are prepared, and the piezoelectric element 16 is attached to the casing 12.

Then, the lead wires 24*a* and 24*b* are soldered to the casing 12 and the piezoelectric element 16, respectively.

Then, the substrate 20 having the pin terminals 22*a* and 22*b* and the damping member 18 are prepared, and are combined together.

Then, the lead wires 24*a* and 24*b* are soldered to the pin terminals 22*a* and 22*b*, respectively, so that the piezoelectric element 16 is electrically connected to the pin terminals 22*a* and 22*b*.

Then, the substrate 20 and the damping member 18 are stacked on the end surface of the opening portion of the casing 12 and are temporarily attached to each other.

In this manufacturing method, the substrate 20 and the damping member 18 are stacked together after the terminal holes 20*a* and 20*b* and the resin hole 20*c* are formed in the substrate 20 and the terminal holes 18*a* and 18*b* and the resin hole 18*c* are formed in the damping member 18. Then, the damping member 18 is temporarily attached to the end surface of the opening portion of the casing 12. Thus, the damping member 18 and the substrate 20 are disposed on the casing 12. However, the substrate 20 and the damping member 18 are not limited to this manufacturing method. For example, first, the substrate 20 and the damping member 18 may be stacked together, and then the terminal holes 20*a*, 20*b*, 18*a*, and 18*b* and the resin holes 20*c* and 18*c* may be simultaneously formed by forming the through holes. The substrate 20 may also be stacked on the damping member 18 after the damping member 18 is disposed on the end surface of the opening portion of the casing 12.

In addition, in this manufacturing method, the pin terminals 22*a* and 22*b* are inserted though the terminal holes 18*a* and 18*b* in the damping member 18 after being completely press-fitted to the terminal holes 20*a* and 20*b* in the substrate 20. However, the pin terminals 22*a* and 22*b* may also be press-fitted to the terminal holes 20*a* and 20*b* in the substrate 20 after being completely inserted through the terminal holes 18*a* and 18*b* in the damping member 18. In addition, the pin terminals 22*a* and 22*b* may also be simultaneously press-fitted to and inserted through the terminal holes 20*a*, 20*b*, 18*a*, and 18*b* in the substrate 20 and the damping member 18 after the substrate 20 and the damping member 18 are stacked together.

Then, foamable silicone is introduced into the inner space of the casing 12 through the resin holes 20*c* and 18*c*. Then, the foamable silicone is foamed and cured by applying heat. Thus, the inner space of the casing 12 and other spaces are filled with the foamable resin 26. In this process, excess foamable silicone is pushed out through the resin holes 18*c* and 20*c*. Therefore, the foamable resin 26 is expanded by an adequate internal pressure in the casing 12, and the inner space of the casing 12 including corners thereof can be reliably filled with the foamable resin 26. In addition, the inner space of the casing 12 can be uniformly filled with the foamable resin 26.

Thus, the ultrasonic sensor 10 is manufactured.

According to the above-described method for manufacturing the ultrasonic sensor 10, first, the substrate 20 and the damping member 18 are disposed on the casing 12. Then, the foamable resin 26 is introduced into the inner space of the casing 12 through the resin holes 20*c* and 18*c* formed in the substrate 20 and the damping member 18, respectively. Thus, the damping member 18 functions as a lid of the casing 12 and the inner space of the casing 12 can be filled with the foamable resin 26 without leaving unfilled spaces. In addition, since the inner space of the casing 12 is filled with the foamable resin 26 while the substrate 20 and the damping member 18 placed on the end surface of the casing 12 is maintained in a level orientation, the end portions of the pin terminals 22*a* and 22*b* are prevented from being displaced. In addition, the damping member 18 is held and fixed to the end surface of the opening portion of the casing 12 by the foamable resin 26 from the inside of the casing 12. Therefore, the damping member 18 can be maintained in a level orientation, and the positional accuracy of the pin terminals 22*a* and 22*b* can be reliably ensured even when, for example, an external stress is applied.

When, for example, the ultrasonic sensor 10 is used in a backup sensor of an automobile, the piezoelectric element 16 is excited by applying a drive voltage to the pin terminals 22*a* and 22*b*. The bottom portion 12*a* of the casing 12 is vibrated in response to vibration of the piezoelectric element 16. As a result, ultrasonic waves are emitted in a direction substantially perpendicular to the bottom portion 12*a*. When the ultrasonic waves emitted by the ultrasonic sensor 10 are reflected by an object and reach the ultrasonic sensor 10, the piezoelectric element 16 is vibrated. The vibration of the piezoelectric element 16 is converted into an electric signal, and the electric signal is output from the pin terminals 22*a* and 22*b*. The distance between the ultrasonic sensor 10 and the object can be determined by measuring the time from when the drive voltage is applied to when the electric signal is output.

In the ultrasonic sensor 10, vibration of the entire body of the casing 12 can be suppressed by the foamable resin 26 with which the inner space of the casing 12 is uniformly filled.

In addition, in the ultrasonic sensor 10, transmission of vibration from the casing 12 to the pin terminals 22*a* and 22*b* and vibration interference between the casing 12 and the pin terminals 22*a* and 22*b* are reduced or eliminated by the damping member 18 and the foamable resin 26. Therefore, the influence of a vibration leakage signal on a reverberation signal and a reception signal in the process of detecting an object can be reduced. In other words, degradation of reverberation characteristics due to vibration leakage can be eliminated. In addition, influence of transmission of unnecessary vibration from the outside through the pin terminals 22*a* and 22*b* can also be suppressed.

In addition, in the ultrasonic sensor 10, the piezoelectric element 16 is disposed on the casing 12 and the substrate 20 to which the pin terminals 22*a* and 22*b* are fixed is attached to the casing 12 with the damping member 18 disposed therebetween. Thus, the substrate 20 is not in direct contact with the casing 12. As a result, transmission of vibration from the piezoelectric element 16 toward the substrate 20 and the pin terminals 22*a* and 22*b* through the casing 12 is suppressed by the damping member 18. In other words, vibration of the piezoelectric element 16 is not easily transmitted to the substrate 20 and the pin terminals 22*a* and 22*b* and is not easily damped.

In addition, in the ultrasonic sensor 10, the damping member 18 is disposed between the end surface of the opening portion of the casing 12 and the one principal surface of the substrate 20. Thus, the one principal surface of the substrate 20 faces the end surface of the opening portion of the casing 12, which is relatively hard, across the damping member 18. Therefore, the levelness of the substrate 20 with respect to the casing 12 and the piezoelectric element 16 is ensured and the perpendicularity of the pin terminals 22*a* and 22*b* is improved. As a result, the positional accuracy of end portions (end portions at the mounting side) of the pin terminals 22*a* and 22*b* at the other end thereof can be increased.

Even when, for example, a top surface (surface at the piezoelectric-element-16 side) of the ultrasonic sensor 10 is pressed from the outside after the ultrasonic sensor 10 is mounted, the casing 12 and the piezoelectric element 16 do not significantly move relative the substrate 20 and the pin terminals 22*a* and 22*b*. Therefore, large stress or displacement does not occur at electrical connecting portions of the pin terminals 22*a* and 22*b* in the casing 12. As a result, defects such as disconnection do not easily occur.

Experimental Example

Figure 5:
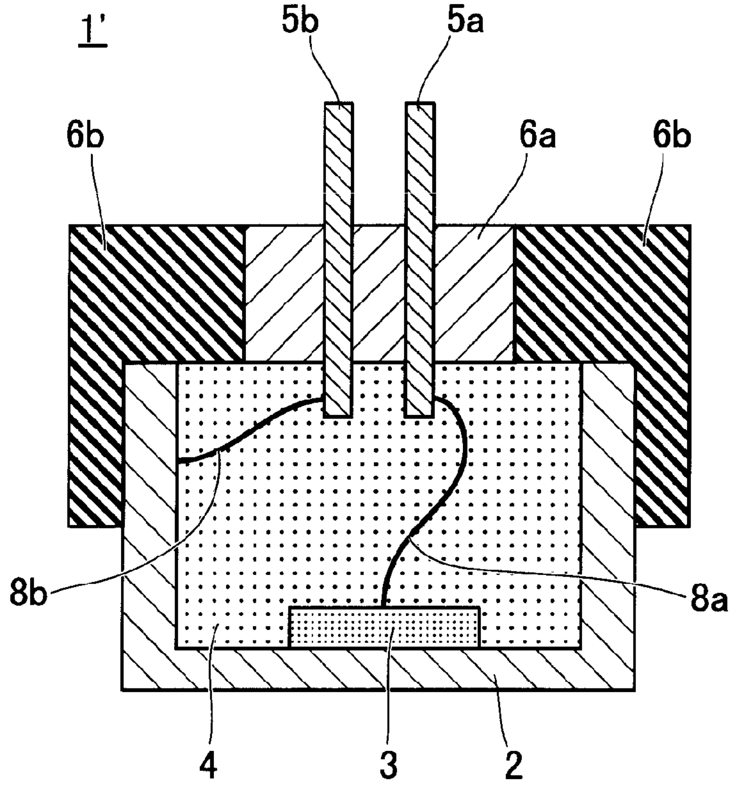
FIG. 5 shows an example of an ultrasonic sensor which provides a basis of the present invention.

As an experiment, twenty ultrasonic sensors 10 having the structure shown in FIG. 1 were manufactured as an example, and twenty ultrasonic sensors 1' having the structure shown in FIG. 5 were manufactured as a comparative example. The inner and outer diameters of the casings 12 and 2, the outer diameters of the substrates 20 and 6*a*, and the outer diameters of the damping members 18 and 6*b* were set as shown in Table 1. Pin terminals having substantially the same structure as that of the pin terminals 22*a* and 22*b* included in the ultrasonic sensors 10 of the example were used as the terminals 5*a* and 5*b* in the ultrasonic sensors 1' of the comparative example.

TABLE 1

| | Outer Diameter of Casing (mm) | Inner Diameter of Casing (mm) | Outer Diameter of Substrate (mm) | Outer Diameter of Damping Member (mm) |
|---|---|---|---|---|
| Example | 14.0 | 12.0 | 13.0 | 13.0 |
| Comparative Example | 14.0 | 12.0 | 6.0 | 16.0 |

The perpendicularity of the pin terminals and the amount of change caused when a load is applied were measured for each of the twenty ultrasonic sensors of the example and the twenty ultrasonic sensors of the comparative example. The measurement result is shown in Table 2. With regard to the perpendicularity of the pin terminals, the positional shift between an end portion and a substrate portion of each pin terminal substantially perpendicular to the bottom portion of the casing were measured. The average and the standard deviation (σn−1) of the positional shift are shown in Table 2. With respect to the amount of change caused when a load is applied, the amount of displacement of the substrate surface relative to the bottom portion of the casing when a load of about 10N is applied to the substrate was measured. The average of the displacement is shown in Table 2.

TABLE 2

| | Positional Shift between End and Substrate Portions of Pin Terminal (Average) (mm) | Positional Shift between End and Substrate Portions of Pin Terminal (σn − 1) (mm) | Displacement of Substrate Surface under Load of 100N (mm) |
|---|---|---|---|
| Example | 0.14 | 0.09 | 0.13 |
| Comparative Example | 0.35 | 0.23 | 0.20 |

As is clear from Table 2, according to the example, since the hard casing made of metal is disposed at the outer peripheral area of the substrate, the levelness of the substrate is increased as compared to that of the comparative example. In addition, the perpendicularity of the pin terminals is improved and the positional accuracy of the end portions of the pin terminals is increased.

For the same reason, according to the example, the amount of displacement of the substrate surface relative to the bottom portion of the casing when the external stress is applied from the outside can be reduced as compared to that in the comparative example. Thus, stress and displacement that occur in areas where the pin terminals are electrically connected to the lead wires are reduced, and defects such as disconnection do not easily occur.

Figure 2:
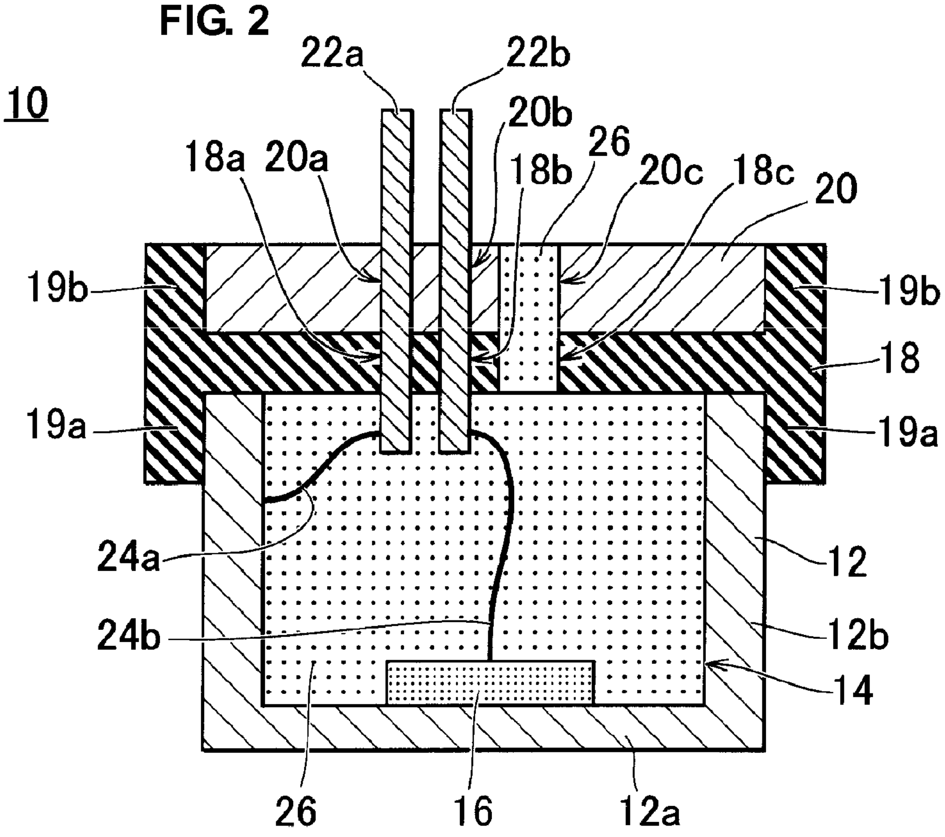
FIG. 2 shows another preferred embodiment of an ultrasonic sensor according to the present invention.

FIG. 2 shows another preferred embodiment of an ultrasonic sensor according to the present invention. In an ultrasonic sensor 10 shown in FIG. 2, in contrast to the ultrasonic sensor 10 shown in FIG. 1, a disc-shaped substrate 20 is configured such that an outer diameter thereof is substantially equal to that of a casing 12. An outer diameter of the damping member 18 is greater than that of the casing 12. A cylindrical portion 19*a* is provided on one principal surface of the damping member 18 along the periphery thereof, and an inner diameter of the cylindrical portion 19*a* is substantially equal to the outer diameter of the casing 12. In addition, a cylindrical portion 19*b* is provided on the other principal surface of the damping member 18 along the periphery thereof, and an inner diameter of the cylindrical portion 19*b* is substantially equal to the outer diameter of the substrate 20. Thus, the damping member 18 is formed so as to cover an opening portion of the casing 12 (in particular, an end surface and an outer surface of an end portion of a side wall 12*b*), and one principal surface and a side surface of the substrate 20.

In the ultrasonic sensor 10 shown in FIG. 2, unlike the ultrasonic sensor 10 shown in FIG. 1, the damping member 18 is formed so as to cover the opening portion of the casing 12, in particular, the end surface and the outer surface of the end portion of the side wall 12*b*, and the one principal surface and the side surface of the substrate 20. Therefore, the casing 12, the damping member 18, and the substrate 20 can be easily positioned with respect to each other and the ultrasonic sensor can be easily assembled.

Figure 3:
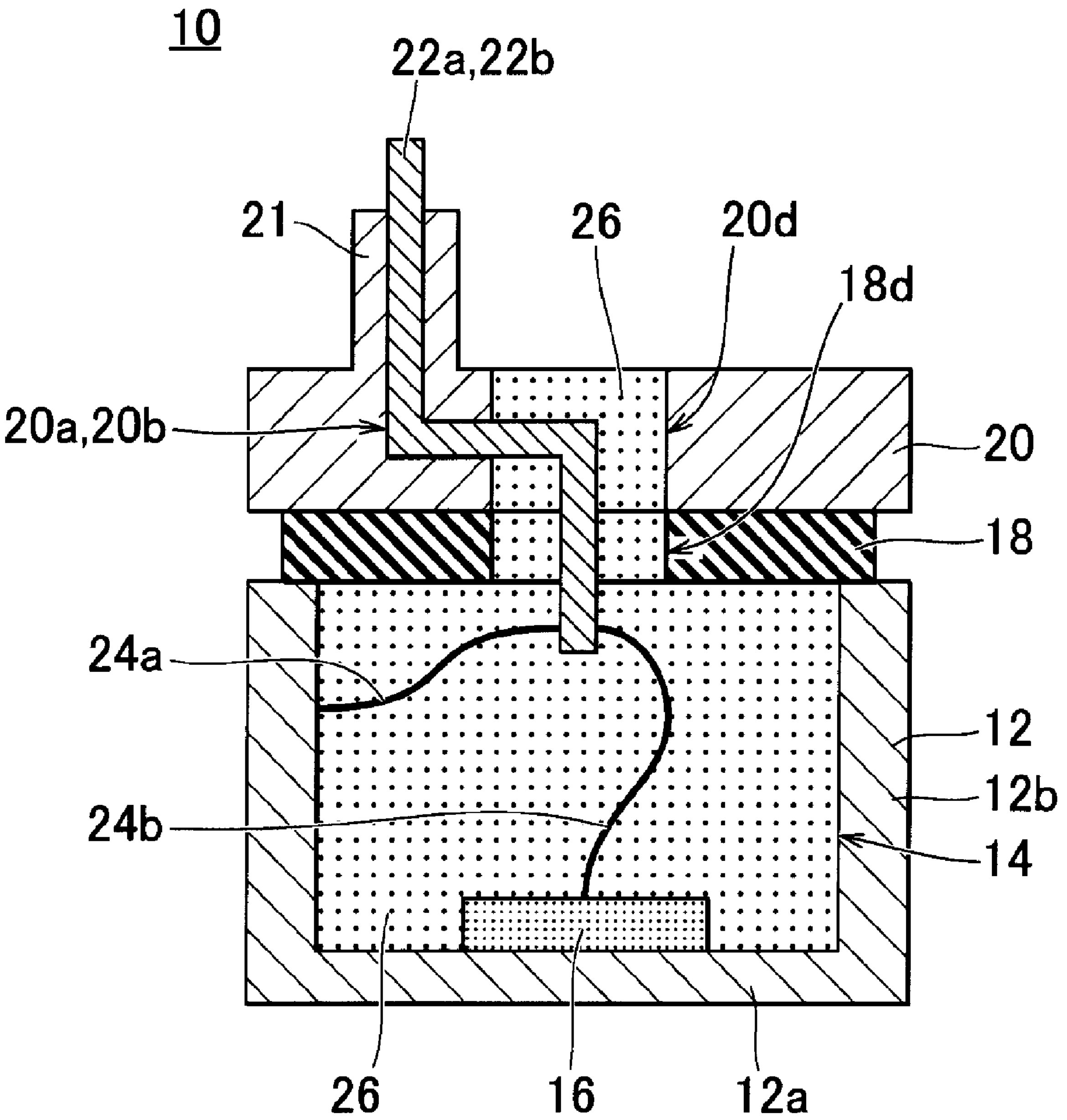
FIG. 3 shows still another preferred embodiment of an ultrasonic sensor according to the present invention.
Figure 4:
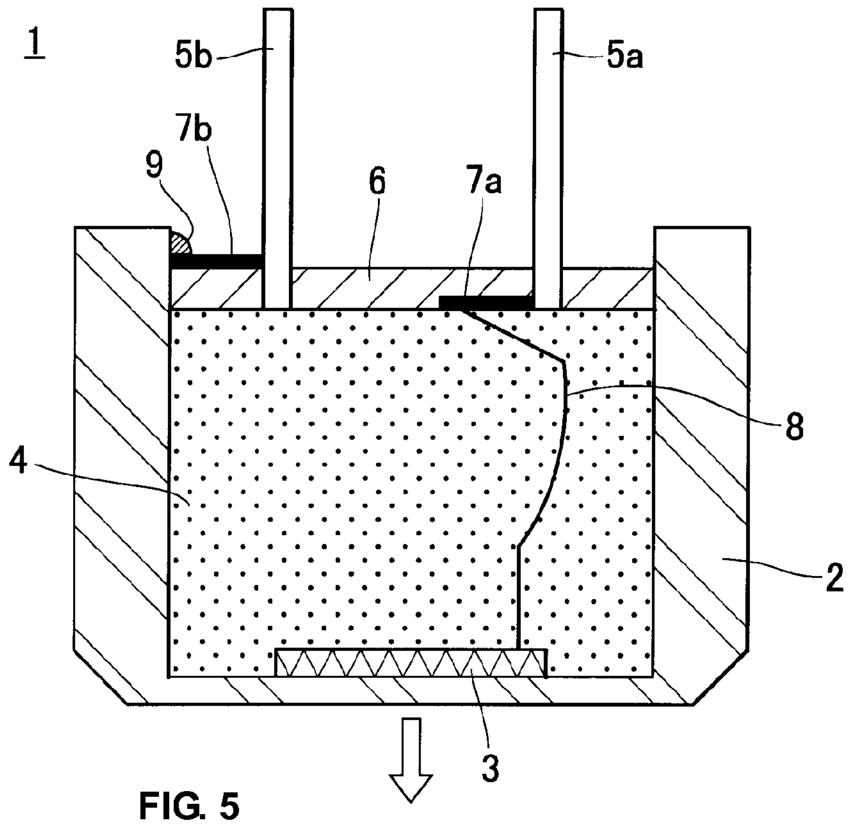
FIG. 4 PRIOR ART
FIG. 4 shows an example of a known ultrasonic sensor.

FIG. 3 shows still another preferred embodiment of an ultrasonic sensor according to the present invention. In an ultrasonic sensor 10 shown in FIG. 3, in contrast to the ultrasonic sensor 10 shown in FIG. 1, each of pin terminals 22*a* and 22*b* is crank shaped. The pin terminals 22*a* and 22*b* are formed by, for example, subjecting a flat plate to a press-working process and then performing a bending process using a mold.

In the ultrasonic sensor 10 shown in FIG. 3, a damping member 18 and a substrate 20 include common holes 18*d* and 20*d*, respectively. The holes 18*d* and 20*d* allow the pin terminals 22*a* and 22*b* to extend therethrough and are filled with foamable resin 26.

In the ultrasonic sensor 10 shown in FIG. 3, a holder 21 is formed on the other principal surface of the substrate 20. The holder 21 holds portions of the pin terminals 22*a* and 22*b* near the ends thereof, that is, portions extending from intermediate portions of the pin terminals 22*a* and 22*b* to positions near end portions thereof.

In the ultrasonic sensor 10 shown in FIG. 3, L-shaped terminal holes 20*a* and 20*b* are formed so as to extend from an end surface of the holder 21 provided on the other principal surface of the substrate 20 to the common hole 20*d*. The substrate 20 including the pin terminals 22*a* and 22*b* shown in FIG. 3 is formed by, for example, molding a material of the substrate in an area around predetermined portions of the pin terminals 22*a* and 22*b* formed in a crank shape.

In the ultrasonic sensor 10 shown in FIG. 3, since portions of the pin terminals 22*a* and 22*b* that are disposed in the substrate 20 are subjected to a bending process, the pin terminals 22*a* and 22*b* are securely fixed to the substrate 20. Therefore, the pin terminals 22*a* and 22*b* are prevented from being even slightly pushed into or pulled out from the substrate 20. Thus, the positional accuracy of the end portions of the pin terminals 22*a* and 22*b* is increased. In addition, positions of the pin terminals 22*a* and 22*b* on the side of the one principal surface of the substrate 20 can be different from those on the side of the other principal surface of the substrate 20. Therefore, the degree of freedom in the arrangement of the pin terminals 22*a* and 22*b* and the arrangement of the ultrasonic sensor is increased.

In addition, in the ultrasonic sensor 10 shown in FIG. 3, the substrate 20 includes the holder 21 arranged to hold the portions of the pin terminals 22*a* and 22*b* near the ends thereof. Thus, the portions of the pin terminals 22*a* and 22*b* near the ends thereof are held by the holder 21, so that the positional accuracy of the end portions of the pin terminals 22*a* and 22*b* is increased. To increase the positional accuracy of the end portions of the pin terminals 22*a* and 22*b*, the holder 21 may also be configured such that the holder 21 holds only the portions of the pin terminals 22*a* and 22*b* near the ends thereof.

In each of the above-described ultrasonic sensors 10, silicone rubber is used as the material of the damping member 18. However, other materials, such as foamable sponge, for example, may also be used in place of silicone rubber as long as the damping effect is obtained.

In addition, in each of the above-described ultrasonic sensors 10, a sheet-shaped sound-absorbing member, such as felt, may be provided on the electrode on the other principal surface of the piezoelectric element 16. The sheet-shaped sound-absorbing member is arranged to absorb the ultrasonic waves emitted from the piezoelectric element 16 toward the inside of the casing 12 and prevents vibration of the piezoelectric element 16 from being suppressed by the foamable resin 26.

Although the size, the shape, the arrangement, the material, and the number of components in each of the ultrasonic sensors 10 have been described, they may be changed as necessary within the scope of the present invention.

The ultrasonic sensor according to preferred embodiments of the present invention may be used in, for example, a backup sensor of an automobile.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An ultrasonic sensor, comprising:

a casing having a bottom portion;

a piezoelectric element disposed on an inner bottom surface of the casing;

a terminal electrically connected to the piezoelectric element;

a substrate to which the terminal is fixed; and a damping member made of rubber; wherein the substrate is attached to the casing with the damping member provided therebetween so that the substrate is not in direct contact with the casing, the damping member suppressing transmission of vibration; and the damping member is disposed between an end surface of the casing and a principal surface of the substrate so as to cover an opening portion of the casing.

2. The ultrasonic sensor according to claim 1, wherein the damping member is arranged to cover a portion of the casing and a portion of the substrate.

3. The ultrasonic sensor according to claim 1, wherein a portion of the terminal that is disposed in the substrate includes at least one bent portion.

4. The ultrasonic sensor according to claim 1, wherein the substrate includes a holder arranged to hold at least a portion of the terminal that is near an end thereof.

5. The ultrasonic sensor according to claim 1, further comprising a foamable filler disposed inside the casing.

6. The ultrasonic sensor according to claim 1, wherein an outer diameter of the substrate and the damping member are substantially the same.

7. The ultrasonic sensor according to claim 1, wherein an outer diameter of at least one of the substrate and the damping member is less than an outer diameter of the casing.

8. The ultrasonic sensor according to claim 1, wherein an outer diameter of the substrate is substantially equal to an outer diameter of the casing.

9. The ultrasonic sensor according to claim 1, wherein the damping member includes a substantially cylindrical portion provided on one principal surface along the periphery thereof, and an inner diameter of the substantially cylindrical portion is substantially equal to an outer diameter of the casing.

10. The ultrasonic sensor according to claim 9, wherein the damping member further includes another substantially cylindrical portion provided on the other principal surface along the periphery thereof, and an inner diameter of the another substantially cylindrical portion is substantially equal to an outer diameter of the substrate.

* * * * *